(12) United States Patent
Rhodes et al.

(10) Patent No.: US 7,341,816 B2
(45) Date of Patent: Mar. 11, 2008

(54) METHOD OF CONTROLLING THE DIFFERENTIAL DISSOLUTION RATE OF PHOTORESIST COMPOSITIONS, POLYCYCLIC OLEFIN POLYMERS AND MONOMERS USED FOR MAKING SUCH POLYMERS

(75) Inventors: Larry F. Rhodes, Silver Lake, OH (US); Chun Chang, Stow, OH (US); Leah J. Langsdorf, Akron, OH (US); Howard A. Sidaway, Brecksville, OH (US); Hiroshi Ito, San Jose, CA (US)

(73) Assignees: Promerus, LLC, Brecksville, OH (US); International Business Machines Corporation, Armonk, NY (US)

( * ) Notice: Subject to any disclaimer, the term of this patent is extended or adjusted under 35 U.S.C. 154(b) by 195 days.

(21) Appl. No.: 10/783,174

(22) Filed: Feb. 20, 2004

(65) Prior Publication Data

US 2004/0166436 A1    Aug. 26, 2004

Related U.S. Application Data

(60) Provisional application No. 60/449,785, filed on Feb. 24, 2003.

(51) Int. Cl.
*G03F 7/004* (2006.01)

(52) U.S. Cl. .................... 430/270.1; 430/905

(58) Field of Classification Search ............ 430/270.1, 430/286.1, 905, 907, 910
See application file for complete search history.

(56) References Cited

U.S. PATENT DOCUMENTS

| 6,143,472 | A | 11/2000 | Sumino et al. |
| 6,165,672 | A | 12/2000 | Jung et al. |
| 6,284,429 | B1 * | 9/2001 | Kinsho et al. ........... 430/270.1 |
| 6,358,675 | B1 | 3/2002 | Boardman et al. |
| 6,503,686 | B1 | 1/2003 | Fryd et al. |
| 6,624,335 | B2 * | 9/2003 | Tachibana et al. .......... 568/664 |
| 6,723,486 | B2 * | 4/2004 | Goodall et al. .......... 430/270.1 |
| 6,790,579 | B1 * | 9/2004 | Goodall et al. ............ 430/170 |
| 6,866,984 | B2 * | 3/2005 | Jung et al. ............... 430/270.1 |
| 2002/0004570 | A1 | 1/2002 | Zampini et al. |
| 2002/0136982 | A1 * | 9/2002 | Goodall et al. .......... 430/270.1 |
| 2003/0004289 | A1 * | 1/2003 | Shin et al. .................. 526/171 |
| 2003/0232276 | A1 * | 12/2003 | Poss et al. ............... 430/270.1 |

FOREIGN PATENT DOCUMENTS

EP     1 004 568     3/2000

* cited by examiner

*Primary Examiner*—John S. Chu
(74) *Attorney, Agent, or Firm*—The Webb Law Firm

(57) ABSTRACT

A photoresist composition encompassing a polymer having at least one polycyclic olefin repeat unit having a desired exo mole percent is provided, where the repeat unit is derived from a polycyclic olefin monomer having the desired exo mole percent. Such polymers having such repeat units having a desired exo mole percent offer control of differential dissolution rate and hence provide enhanced imaging properties. Exemplary monomers having a desired exo mole percent are also provided.

6 Claims, 3 Drawing Sheets endo  exo

Endo:Exo Ratio as Determined by Gas Chromatography

| HFANB Samples | Endo:Exo ratio by GC |
|---|---|
| 1 | 44:56 |
| 2 | 58:42 |
| 3 | 70:30 |
| 4 | 78:22 |
| 5 | 85:15 |
| 6 | 90:10 |

58/42
Mn=13000

78/22
Mn=10700

90/10
Mn=9190

58/42
Mn=3520

78/22
Mn=3290

90/10
Mn=3100

METHOD OF CONTROLLING THE DIFFERENTIAL DISSOLUTION RATE OF PHOTORESIST COMPOSITIONS, POLYCYCLIC OLEFIN POLYMERS AND MONOMERS USED FOR MAKING SUCH POLYMERS

CROSS-REFERENCE TO RELATED APPLICATIONS

This application claims the benefit of priority under 35 U.S.C. § 119 of U.S. Provisional Application Ser. No. 60/449,785 filed on Feb. 24, 2003.

TECHNICAL FIELD

The present invention relates generally to controlling the dissolution rate of polymers used in forming photoresist compositions and more specifically to polymers having a cycloalkyl repeat unit for controlling the dissolution rate of such polymers in photoresist compositions and the compositions thereof.

BACKGROUND

Photoresists are photosensitive films used for transferring an image formed therein to an underlying layer or substrate. A layer of a photoresist is formed over a substrate and generally a layer of a material to which the image is to be transferred. The photoresist layer is then exposed through a photomask to a source of activating radiation where the photomask has some areas that are opaque to such radiation and other areas that are transparent. A photoinduced chemical transformation results in the areas exposed to the activating radiation which allows for the development of a relief image therein.

Photoresists can be either positive-tone or negative-tone. Generally, negative-tone photoresists undergo a crosslinking reaction within those portions of the photoresist layer that are exposed to activating radiation. As a result, the exposed portions become less soluble than unexposed portions in a solution used to develop the relief image. In contrast, for positive-tone photoresists, the exposed portions of the photoresist layer become more soluble, in a developer solution, than the portions unexposed to such radiation.

As microelectronic devices, such as integrated circuits, employ smaller and smaller device structures to effect their function, the need for photoresist compositions capable of resolving such device structures becomes increasingly important. While the ability of a particular photoresist composition to resolve a particular device structure is a function of many factors, one such factor is control of the difference in the dissolution rates of exposed and unexposed portions of the photoresist. While this factor has been studied previously, the thrust of such study has generally been to develop additives that might serve to increase the difference in the dissolution rate of such exposed and unexposed portions in a developer solution. However, such additives can affect other properties of the photoresist composition in a less than desirable manner, for example by increasing the optical density of the composition at the working wavelength of the activating radiation, and perhaps of more import, merely increasing the difference in the dissolution rates of exposed and unexposed regions does not always control the differential dissolution rate.

Thus it would be desirable to provide photoresist compositions with controlled differential dissolutions rates. That is to say, the difference between the dissolution rates of exposed and unexposed portions of the photoresist is controllable. It would also be desirable for such photoresist compositions to encompass a polymeric material that provides such control of the differential dissolution rate without the need for an additive. In addition, it would be desirable to provide such polymeric materials for use as base resins of such photoresist compositions and to provide methods of forming such desirable polymers.

DETAILED DESCRIPTION

Figures 1, 2:
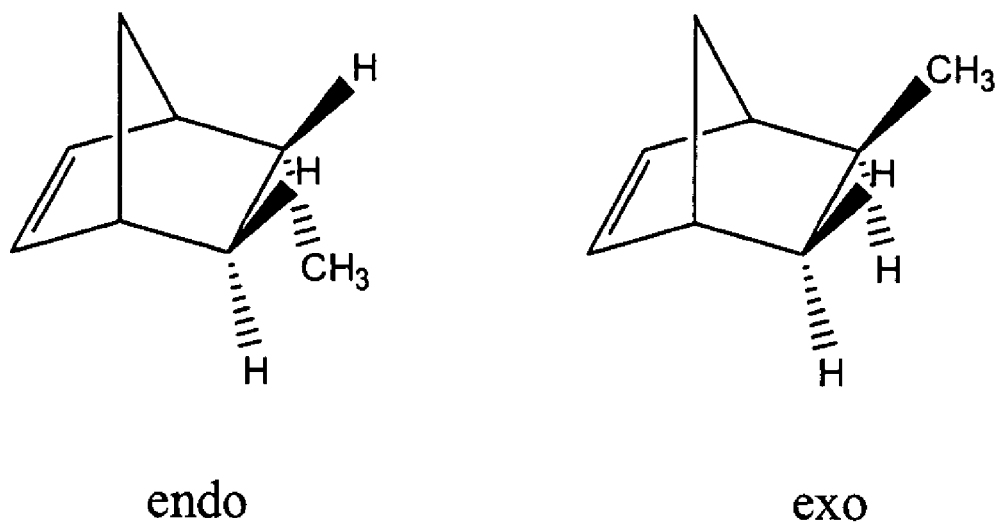
FIG. 1 is a pictorial representation of an exo and an endo isomer of 5-methyl-2-norbornene.
FIG. 2 is a table showing the exo/endo isomer ratio of the several α,α-bis(trifluoromethyl)bicyclo[2.2.1]hept-5-ene-2-ethanol (HFANB) monomers used for polymerizations in accordance with embodiments of the present invention.

The preparation of norbornene derivatives, hereinafter referred to as monomers that are useful for forming polycyclic olefin resins, generally results in a mixture of exo and endo isomers being formed (see FIG. 1). Generally, purification of a reaction mixture from the synthesis of a monomer useful in embodiments of the present invention encompasses fractional distillation methods. It has been observed that different fractions collected from such a distillation have different ratios of the aforementioned exo and endo isomers (see, FIG. 2). To determine what effect such differences in the isomer ratio might have on the characteristics of polymers formed from the different fractions, homopolymers were formed of each of the several fractions.

Advantageously, it has been found that the resultant polycyclic olefin resins exhibited unexpected variations in their dissolution rate. Unexpected because rather than observing the dissolution rate of such resins varying as a function of molecular weight (either expressed as Mn or Mw) as normally observed, the variations seem to be primarily a function of the ratio of exo to endo isomers in the monomer starting material (see, FIG. 3).

For example a first resin with Mn=3560 polymerized from a monomer having an exo isomer mole percent (mol %) of 48, is found to have a dissolution rate (DR) of 3920 Angstroms per sec (Å/sec) while a second, analogous resin polymerized from the same starting monomer but with approximately twice the molecular weight (Mn=7520) is found to have a DR of 3850 Å/sec. Thus, unexpectedly, resins having very different molecular weights have essentially the same DR (see, Examples 21 and 22 in Table 1).

Similarly, for a third resin with Mn=3270 and polymerized from a monomer having 22 mol % of the exo isomer, the DR is found to be 6627 Å/sec, while an analogous fourth resin with Mn=13700 again polymerized from the same starting monomer but having about four times the molecular weight is found to have essentially the same DR (DR=6543 Å/sec., see, Examples 16 and 20 in Table 1).

For each of the above examples, the resin is a homopolymer of, α,α-bis(trifluoromethyl)bicyclo[2.2.1]hept-5-ene-2-ethanol (HFANB), formed in essentially the same manner. Thus, for each of the pairs (21 and 22, 16 and 20), only the concentration of a chain transfer agent used for the polymerization is changed to provide polymers having different molecular weights.

Comparing the DR of the first pair of resins (21 and 22) to the second pair of resins (16 and 20), it is apparent that the second pair of resins has a DR of about twice that of the first pair of resins. As both pairs of resins are HFANB homopolymers differing only in the mole percent of exo isomer in the starting monomer, Applicants believe that this difference in dissolution rate is a function of this difference in exo isomer mole percent. Thus it seems that where the concentration of exo isomer in the starting monomer is decreased, for example from 48 mol % in the first pair of resins to 22 mol % in the second pair of resins, the dissolution rate is increased.

Figure 3:
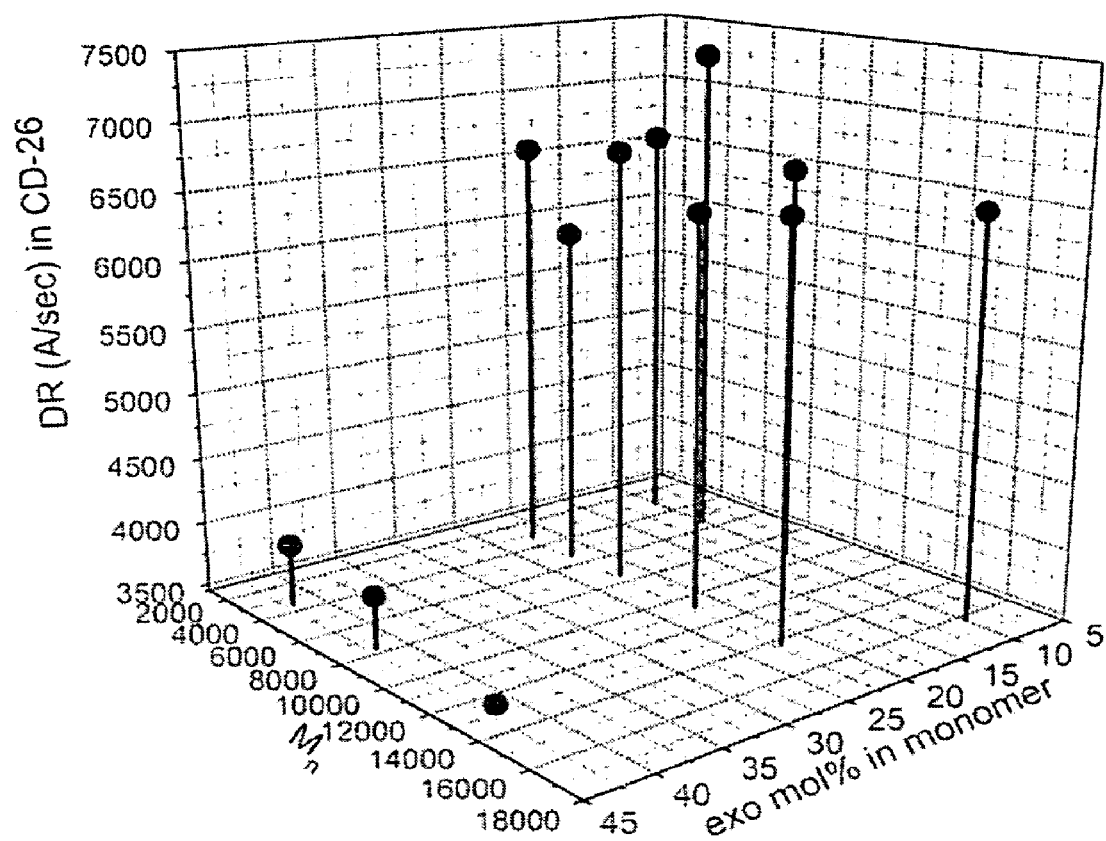
FIG. 3 is a three dimensional bar graph that plots dissolution rate versus molecular weight and exo isomer mole percent for exemplary embodiments in accordance with the present invention.

Turning to FIG. 3, a three dimensional bar graph showing values of DR versus exo mol % versus molecular weight (Mn) for each of Examples 12-23 (see, Table 1), illustrates this relationship. However, it will be noted that rather than a linear relationship between exo mol % and DR, there appears to be a threshold at a value of exo mol % between about 25% and 40%. That is to say, a first range of exo isomer contents seems to exhibit a relatively constant first DR (between about 6000 to 7200 Å/sec), while a second range of exo isomer contents seems to exhibit a relatively constant second DR (between about 3500 and 4000 Å/sec) significantly different from the first DR.

It should be noted that while the Applicants advance no specific theory to explain the unexpected results observed (see above and FIG. 3), it is well known that the dissolution rate of a polymer is a function of its solubility in developer solutions, which is in turn a function of the specific pendant group substituents present on the repeat units that form the polymer backbone. In addition, where those repeat units are derived from polycyclic olefins, polymer solubility will also be a function of whether pendant groups are substituted in an exo or endo position as it is well known that the reactivity of a pendant group is higher where that group is exo substituted as opposed to the same group being endo substituted. Therefore, while it has been generally observed that polymer dissolution rate is often a function of molecular weight, where other factors are the same, Applicants believe that the dissolution rate of a polymer can be effectively controlled by altering whether a reactive pendant group's substitution into an exo position of a polymer repeat unit is enhanced or diminished with what normally is expected.

Not withstanding the above, it is also well known that understanding the dissolution rate behavior of binder resins, is both important in the development of high performance photoresist formulations and complex. For example, Ito, et al., *Proceedings of SPIE*, 2003, 5039, 70 reported that homopolymers of HFANB made with both Ni and Pd catalysts exhibited "no straightforward relationship between dissolution rate [in 0.26 N TMAH] and Mn or Mw" when investigated using quartz crystal microbalance methods. Ito also investigated the dissolution rate behavior of the same polymers using a more dilute, 0.21 N, TMAH solution but found the dissolution behavior complex and seemingly dependant on the molecular weight polydispersity of the polymer. Hoskins et al, *Proceedings of SPIE*, 2003, 5039, 600, reported the dissolution rate behavior of HFANB homopolymers in a 0.19 N TMAH solution where the homopolymers were made using only Pd catalysts. Using optical interferometric methods to measure dissolution rates, Hoskins reported that the HFANB homopolymers were found to "exhibit an a typical dependence of dissolution rate on molecular weight". Thus Hoskins found that low molecular weight HFANB homopolymers (Mw<10,000) exhibited decreasing dissolution rates with increasing molecular weights while homopolymers with Mw>10,000 but <100,000 exhibited increasing dissolution rates with increasing molecular weight. However, it should be noted that the molecular weight polydispersity of the Hoskins samples were quite broad, ranging from 1.91 to 9.21, thus potentially complicating interpretation of the dissolution rate behavior.

Therefore, to simplify the investigation of dissolution rate behavior, Applicants elected to prepare HFANB homopolymers using only Pd catalysts and process conditions that would result in relatively narrow molecular weight polydispersities (i.e., 1.50 to 2.50). In addition, and to further avoid complexities, Applicants measured the dissolution rate behavior of such homopolymers using only a standard 0.26 N TMAH solution and quartz crystal microbalance methods.

Thus, by and through obtaining this increased understanding of dissolution rate behavior, Applicants believe that it is possible to create binder resins for photoresist compositions, both positive-acting and negative-acting, that take advantage of this understanding and hence allow for the difference between the dissolution rate of exposed and unexposed portions of photoresist layers (the differential dissolution rate) to be controlled. Additionally, it is believed and shown herein that this understanding can lead to better imaging results over a broader range of polymer parameters, for example variations in molecular weight. It should be further noted that the selection of HFANB monomers for the homopolymers studied, was also influenced by the use of such monomers in a large number of photoresist binder resin formulations that have been reported and thus the understanding obtained would be more readily applied.

In addition, the homopolymers used in the dissolution rate study were prepared using both olefinic and non-olefinic chain transfer agents (CTAs). Analysis of the homopolymers so formed, indicates that physical characteristics of the polymers, for example Mw, Mn, OD (optical density) and the like, can be varied by the choice of the CTA employed during the polymerization:

While the above observations were of homopolymers formed by vinyl addition polymerization, it has been shown that polymers formed using more than one type of monomer will exhibit similar dissolution rate effects that should also lead to enhanced imaging. Therefore, the monomers that will be useful in the practice of embodiments in accordance with the present invention are described below where the polymers formed from such monomers will encompass at least one monomer having a desired exo isomer mol %.

Embodiments in accordance with the present invention include repeat units derived from norbornene-type monomers having an acid labile protected pendant group. Such monomers are represented by Formula A, below:

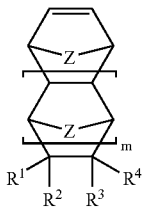

Formula A where m and Z are defined above and where at least one of $R^1$, $R^2$, $R^3$, or $R^4$, independently, is an acid labile protected pendant group that is cleavable by, for example, an acid generated from a photoacid generator. Any known acid labile group known to the literature and to the art can be utilized in the present invention such as those set forth herein with regard to Formula A.

The remaining one or more R1, R2, R3, or R4, groups, independently, can be hydrogen, or a hydrocarbyl having from 1 to about 20 carbon atoms, or halogens selected from F, Cl or Br, or a hydrocarbyl having from 1 to about 20 carbon atoms substituted at any hydrogen atom with an O, S, N, or Si, and the like, or a fluorinated hydrocarbyl having from 1 to about 20 carbon atoms wherein each carbon atom, independently; is substituted with 0, 1, 2, or 3 fluorine atoms.

Returning to descriptions of acid labile protected groups, in some embodiments, such groups are a fluorinated carbinol moiety having from 1 to about 20 carbon atoms wherein each carbon atom, independently, is substituted with 0, 1, 2, or 3 fluorine atoms and the oxygen atom is protected by an acid labile group (i.e., blocking or protective groups) that are cleavable by acids generated from a photoacid generator. Exemplary fluorinated groups include, among others, —$(CR_2)_n$OR', —(O—$(CH_2)_n)_n$—$C(CF_3)_2$—OR', —$(CH_2O)_n$—$C(CF_3)_2$—OR', —$((CH_2)_nO)_n$—$CH_2$—$C(OR')(CF_3)_2$ where each occurrence of n is an independently selected integer from 0 to about 5, each occurrence of R is independently a hydrogen or a halogen (i.e., F, Cl, Br, I) and where R' is the acid labile group. R' includes, but is not limited to, —$CH_2OCH_3$ (dimethyl ether), —$CH_2OCH_2CH_3$ (methyl ethyl ether), —$C(CH_3)_3$, —$Si(CH_3)_3$, —$CH_2Q(O)$O(t-Bu), 2-methylnorbornyl, 2-methylisobornyl, 2-methyl-2-adamantyl, tetrahydrofuranyl, tetrahydropyranoyl, 3-oxocyclohexanonyl, mevalonic lactonyl, dicyclopropylmethyl (Dcpm), or dimethylcyclopropylmethyl (Dmcp) groups, or R' is —C(O)OR" where R" is —$C(CH_3)_3$, —$Si(CH_3)_3$, 2-methylnorbornyl, 2-methylisobornyl, 2-methyl-2-adamantyl, tetrahydrofuranyl, tetrahydropyranoyl, 3-oxocyclohexanonyl, mevalonic lactonyl, Dcpm, or Dmcp groups, or combinations thereof.

In some embodiments of the present invention, Formula A is also represented by Formula A1, below

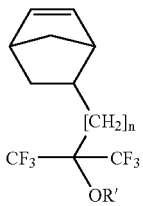

Formula A1 where n and R' are as previously defined. More specifically, exemplary monomers encompassing an acid labile protected pendant group in accordance with Formula A1 encompass:

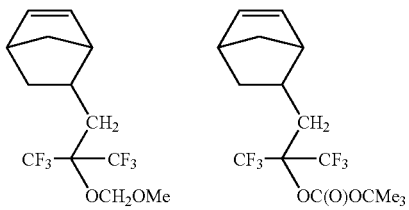

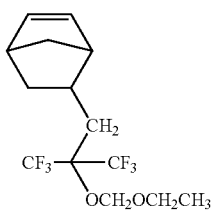

Additionally, norbornene-type monomers in accordance with Formula A are represented by Formula A2, below:

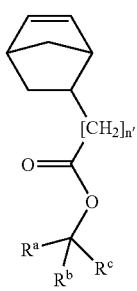

Formula A2 where n' is an integer from 0 to 5 and $R^a$, $R^b$, and $R^c$, independently, represent linear or branched hydrocarbyl groups from $C_1$ to about $C_{20}$ or $R^a$ and $R^b$ taken together along with the common carbon to which they are attached represent a saturated cyclic group containing 4 to 12 carbon atoms. An exemplary norbornene-type monomer in accordance with Formula A2 encompasses:

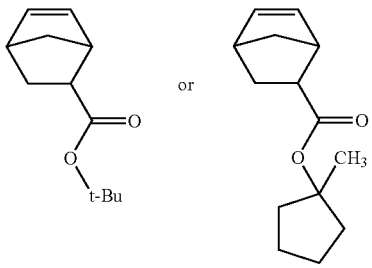

where tBu is a tertiary butyl group.

Some embodiments of the present invention include repeat units derived from norbornene-type monomers having a crosslinking capable pendant group. Such monomers are represented by Formula B, below:

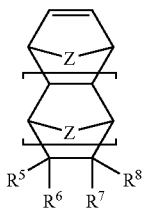

Formula B where m and Z are defined as above, and where each of $R^5$, $R^6$, $R^7$ and $R^8$, independently, are H, a halogen, a linear, branched or cyclic $C_1$ to $C_{30}$ alkyl, an alkylol, an aryl, an aralkyl, an alkaryl, an alkenyl or an alkynyl; with the proviso that at least one of $R^5$, $R^6$, $R^7$ and $R^8$ is a functional group that is capable of crosslinking. Suitable crosslinking capable functional groups include, but are not limited to, hydroxy alkyl ethers according to Formula I:

-A-O—[—(CR"$_2$)$_q$—O—]$_p$—(CR"$_2$)$_q$—OH        Formula I where A is a linking group selected from $C_1$ to $C_6$ linear, branched, or cyclic alkylene, each occurrence of R** is independently selected from H, methyl and ethyl, q is independently an integer from 1 to 5, in some cases from 2 to 5, and p is an integer from 0 to 3.

Other suitable crosslinking capable functional groups are represented by Formulae II, III, IV and V:

—R'''-Q        Formula II

—(CH$_2$)$_n$C(O)OR$^\#$        Formula III

—(CH$_2$)$_t$—C(CF$_3$)$_2$—O—(CH$_2$)$_t$—CO—(OR$^{\#\#}$)        Formula IV where for Formula II, R''' is a linear, branched or cyclic $C_1$ to $C_{30}$ alkylene, arylene, aralkylene, alkarylene, alkenylene or alkynylene linking group that is optionally partially or completely halogenated, and Q is a functional group selected from hydroxyl, carboxylic acid, amine, thiol, isocyanate and epoxy. For Formula III, n is as previously defined and R$^\#$ represents an acid labile group cleavable by a photoacid generator. Finally for Formula IV, each occurrence of t is independently an integer from 1 to 6 and R$^{\#\#}$ is a $C_1$-$C_8$ linear or branched alkyl moiety, and in some instances a t-butyl group.

In addition, some embodiments in accordance with the present invention include repeat units derived from norbornene-type monomers having pendant groups that are exclusive of acid labile protected groups and crosslinking capable groups. Such monomers are represented by Formula C, below:

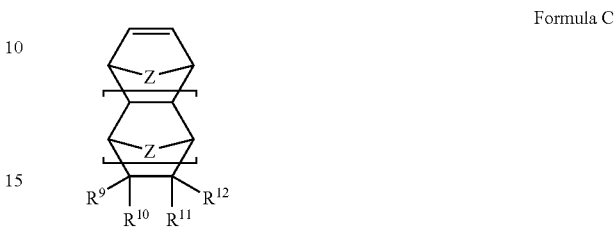

Formula C where m and Z are as previously defined, and where substitutents $R^9$, $R^{10}$, $R^{11}$ and $R^{12}$, are each an independently selected neutral substituent selected from the group of substituents consisting of halogens (i.e., F, Cl, or Br), —(CH$_2$)$_n$—C(O)OR$^{21}$, —(CH$_2$)$_n$—(CM$_2$)$_n$—OR$^{18}$, —(CM$_2$)$_n$—OC(O)R∫, —(CH$_2$)$_n$—OC(O)OR$^{17}$, —(CH$_2$)$_n$—C(O)R$^{18}$, —(CH$_2$)$_n$C(R$^{19}$)$_2$CH(R$^{19}$)(C(O)OR$^{20}$), —(CH$_2$)$_n$—NH—(SO$_2$)—CF$_3$, —(CH$_2$)$_n$C(R$^{19}$)$_2$CH(C(O)OR$^{20}$)$_2$, —C(O)O—(CH$_2$, —OR$^{18}$ and —(CH$_2$)$_n$—O—(CH$_2$)$_n$—OR$^{18}$, —(CH$_2$)$_n$—(O—(CH$_2$)$_n$)$_n$—C(CF$_3$)$_2$OR$^{21}$ where each occurrence of n is independently an integer from 0 to 5, M can be hydrogen or a halogen (i.e., F, Cl, or Br), $R^{19}$ can independently be hydrogen, a halogen, a linear or branched $C_1$ to $C_{10}$ alkyl group or cycloalkyl group or a linear or branched $C_1$ to $C_{10}$ halogenated alkyl group or halogenated cycloalkyl group, $R^{18}$ can independently be hydrogen, a linear or branched $C_1$ to $C_{10}$ alkyl group or cycloalkyl group or a linear or branched $C_1$ to $C_{10}$ halogenated alkyl group or halogenated cycloalkyl group, $R^{20}$ is not readily cleavable by a photoacid generator and can independently be a linear or branched $C_1$ to $C_{10}$ alkyl group or cycloalkyl group or a linear or branched $C^1$ to $C_{10}$ halogenated alkyl group or halogenated cycloalkyl group, $R^{17}$ is not readily cleavable by a photoacid generator and can independently be linear or branched $C_1$ to $C_{10}$ alkyls or halogenated alkyls, a monocyclic or polycyclic $C_4$ to $C_{20}$ cycloaliphatic or halogenated cycloalkyl moiety, a cyclic ether, a cyclic ketone or a cyclic ester (lactone), where each of the cyclic ether, ketone and ester can be halogenated or not and $R^{21}$ is defined as $R^{17}$ plus hydrogen. Exemplary cycloaliphatic moieties include, but are not limited to, unsubstituted cyclopropyl, cyclobutyl, cyclopentyl, cyclohexyl groups as well as 1-adamantyl and 1-norbornyl moieties. Additionally, $R^9$, $R^{10}$, $R^{11}$ and $R^{12}$ can each be an independently selected neutral substituent represented by Formula I:

-A-O—[—(CR$_2$)$_q$—O—]$_p$—(CR"$_2$)$_q$—OH        Formula I where A and q are as defined before, but R is selected from a halogen.

Therefore it will be appreciated that polymers in accordance with embodiments of the present invention encompass repeat units derived from polycyclic olefin monomers in accordance with any one of Formulae A, B and C. Such monomers can be produced by a variety of methods where such methods, as well as catalyst systems for the polymerization of such monomers are discussed in detail in U.S. Pat. Nos. 5,468,819, 5,569,730, 6,136,499, 6,232,417 and 6,455, 650, the disclosures of which are incorporated, in pertinent part, herein. Exemplary methods of forming polycyclic olefin monomers include, Diels-Alder condensations employing cyclopentadiene and an appropriate dienophile or the reaction of an appropriately substituted polycyclic olefin with a desired exo isomer mol %, with a reagent appropriate for forming the final monomer desired.

As disclosed herein above, it has been found that monomers having a desired exo isomer mol % affect the dissolution rate of polymers made therefrom advantageously. In some embodiments, this desired exo isomer mol % is greater than the exo isomer mol % that would be expected for a polycyclic olefin monomer based on the thermodynamic equilibrium of the isomers of the monomer obtained from a Diels-Alder reaction. In other embodiments, the desired exo isomer mol % is less than the exo isomer mol % that would be expected for a polycyclic olefin monomer based on the thermodynamic equilibrium of the isomers of the monomer obtained from a Diels-Alder reaction. Such desired exo isomer mol % monomers can be obtained by selecting appropriate portions of monomer during purification using, for example, fractional distillation methods. However, obtaining such monomers is not limited to fractional distillation or any other purification method. Rather, such desired exo isomer mol % monomers useful for embodiments of the current invention can be obtained by any appropriate method and these appropriate methods and the monomers obtained therefrom are within the scope and spirit of the present invention.

It should be understood that the polymers in accordance with embodiments of the present invention encompass at least one polycyclic olefin repeat unit derived from a polycyclic olefin monomer having a desired exo isomer mol %. However such polymers can also encompass repeat units derived from a variety of other types of monomers. For example, such polymers can include repeat units derived from maleic anhydride monomers, acrylate monomers, trifluoromethylacylate monomers and the like, as well as mixtures of such various types of monomers. In addition, polymers in accordance with the present invention can be formed using any appropriate polymerization method including vinyl addition, ring opening metathesis polymerization (ROMP) and free radical methods with the proviso that the polymerization method does not significant alter the exo isomer mol % of the polycyclic olefin monomer employed. It should also be understood that polymers in accordance with the present invention are not limited to having a single repeat unit having a desirable exo isomer mol %. Thus, polymers encompassing two or more such repeat units are also within the scope and spirit of the present invention.

Advantageous polymers produced in accordance with the present invention encompass addition polymerized polycyclic repeat units linked via 2,3-enchainment. Such polymers include at least one monomer encompassed by Formula C, as defined above, and optionally one or more monomers encompassed by Formulae A and/or B and of any of the other monomer types mentioned above. At least one of such monomers has a desired exo isomer mole % such that the resulting polymer will have a desired dissolution rate or imaging property. Advantageously, the desired exo isomer mol % of the at least one monomer can be obtained by, for example, selecting an appropriate cut or fraction from a fractional distillation of the monomer. However other methods for obtaining a monomer with the desired exo isomer mol % can also be employed, for example by preparing the monomer in a manner that results directly in the desired exo isomer mol %.

It will of course be realized that the resulting dissolution rate and/or imaging property of a polymer employing a repeat unit having the desired exo isomer mol % is also dependent on the relative amount of such repeat unit incorporated within the polymer. Thus, where a polymer incorporates a relatively low concentration of the repeat unit having the desired exo isomer mol %, such low repeat unit concentration can correlate to little or no effect on the dissolution rate or imaging property of the polymer. However where the concentration of the desired exo isomer mol % repeat unit is high, a significant effect on the dissolution rate or imaging property of the resulting polymer is observed. For example, referring to Table 2, below, it is seen that for the polymers of Examples 24, 25 and 26 (about 87% HFANB), the dissolution rate of the polymer behaves in essentially the same manner as is observed for the HFANB homopolymers of Examples 1-23. Where however, the amount of HFANB is reduced, such as in blends of HFANB homopolymer with other materials such as the P(TBTFMA-VENBHFA) copolymer discussed below, the observed effect can be reduced.

Embodiments of the present invention can also include polymers formed from more than one polycyclic olefin monomer having a reactive pendant group (where "reactive" refers to a protected acid labile pendant group or a pendant group involved in the dissolution of the resulting polymer). Thus for each of these monomers there can be a different desired exo isomer mol %. While the combination of such different monomers into a single polymer can require some experimentation to determine the appropriate exo isomer mol % for each monomer and the relative concentration of each monomer within the polymer, Applicants believe that such experimentation is straight forward and well within the ability of one having ordinary skill.

It should be realized by now, that embodiments in accordance with the present invention include both the polymers formed by vinyl addition polymerization, as well as the cyclic olefin monomers employed for forming such polymers, where at least one of such cyclic olefin monomers has a desired exo isomer mol %. In addition, it will be understood that the polymers of some embodiments in accordance with the present invention encompass at least one monomer selected from those in accordance with each of Formulae A, B and C. Such polymers, as well as others in accordance with the present invention, are useful for forming photoresist compositions having a desired dissolution rate and imaging property. Some embodiments in accordance with the present invention will encompass positive tone (positive acting) polymers and the photoresist compositions made therefrom. Other embodiments will encompass negative tone (negative acting) polymers and the photoresist compositions made therefrom. It should be appreciated that the specific monomers having a desired exo isomer mol % that are selected, will include pendant groups that are appropriate for the type of photoresist composition (positive or negative) desired. It should also be apparent that where some embodiments of the present invention will encompass monomers and the resulting repeat units having an enhanced exo isomer mol %, other embodiments of the present invention will encompass monomers and the resulting repeat units having an enhanced endo isomer mol %. It should also be noted that the pendant groups of monomers, and the resulting repeat units, in accordance with the present invention may or may not be protected with acid labile groups. Finally, embodiments in accordance with the present invention include the selection of monomers having a desired exo isomer mol % for combination with any of the various additives used in formulating photoresist compositions. For example, such additives can include photoacid generators, photoinitiators, dissolution rate modifiers and the like, where any of such additives can be monomeric, oligomeric or polymeric in nature.

The various aspects of the invention will be appreciated more fully in light of the following illustrative examples and exemplary formulas for polymers in accordance with the present invention. Such examples are for illustrative purposes only and are not to be construed as limiting the scope and spirit of the present invention. Unless specifically noted otherwise, the molecular weight of the resulting polymers prepared in the following examples, where reported, was determined using GPC methods in THF with a poly(styrene) standard.

Synthesis Example 1

α,α-bis(trifluoromethyl)bicyclo[2.2.1]hept-5-ene-2-ethanol ((HFANB) 80.0 g, 0.292 mol, endo/exo ratio was 44/56), N,N-dimethylanilinium tetrakis(pentafluorophenyl)borate ((DANFABA) 0.0468 g, 0.0584 mMol) and sufficient toluene to bring the total volume to 200 mL were added to a glass pressure reactor. The mixture was purged with hydrogen gas for 30 min then charged with hydrogen (90 psig). The reaction mixture was heated to 80° C. The pressure was relieved and the palladium catalyst, palladium bis(di-isopropylphenylphosphine) diacetate (0.0071 g, 0.012 mMol) was added. The reactor was immediately repressurized with hydrogen gas (90 psig) and allowed to react for 18 h. The reaction mixture was cooled and then filtered through a 0.22 micron Teflon® filter to remove black palladium metal. The resulting filtrate was added to heptane to precipitate the polymer as a white powder. The powder was collected by filtration and dried in a vacuum oven at 90° C. Yield 52.5 g (66%). Mw=11,300; Mn=5440.

Synthesis Example 2

HFANB (19.2 g, 0.701 mol, endo/exo ratio was 70/30), DANFABA (0.0112 g, 0.0140 mMol) and sufficient toluene to bring the total volume to 47 mL were added to a glass pressure reactor. The reactor was charged with 17 psig ethylene and then heated to 80° C. The pressure was relieved and the palladium catalyst, palladium bis(di-isopropylphenylphosphine) diacetate (3 mL of a 0.93 mMol solution in methylene chloride) was added. The reactor was immediately repressurized with ethylene (17 psig) and allowed to react for 20 h. The reaction mixture was cooled and added to an excess of hexane in order to precipitate the polymer. The polymer was collected by filtration and dried in a vacuum oven at 80° C. Yield 9.5 g (50%).

The polymer was then dissolved in 48 mL of toluene. To this mixture was added 24 mL of glacial acetic acid, 12 mL of hydrogen peroxide (30%), and 12 mL of water. The mixture was heated to 80° C. for 3 h. The organic layer was separated and washed four times with water. The organic layer was then concentrated by rotary evaporation then poured into heptane to precipitate the polymer. The polymer was collected by filtration and dried in a vacuum oven at 80° C. Yield 8.8 g. The polymer was redissolved in methanol and precipitated by addition to water. Mw=6400; Mn=3630.

Synthesis Example 3

Synthesis Example 2 was repeated except that a pressure of 5 psig ethylene was used. Yield 11.4 g (59%). The polymer was treated with glacial acetic acid and hydrogen peroxide as in Synthesis example 2. Yield 10.5 g. Mw=12900; Mn=5930.

Synthesis Example 4, 5 and 6

Synthesis examples 4, 5, and 6 were made in a manner identical to Synthesis example 3, but different levels of ethylene were used to access different molecular weights. Yields are found in Table 1, below. The polymers were treated with glacial acetic acid and hydrogen peroxide as in Synthesis example 3. The polymer's molecular weights are found in Table 1, below.

Synthesis Example 7

HFANB (19.2 g, 0.701 mol, endo/exo ratio was 70/30), DANFABA (0.0112 g, 0.0140 mMol) and sufficient toluene to bring the total volume to 47 mL were added to a glass pressure reactor. The mixture was charged with hydrogen gas (90 psig). The reaction mixture was heated to 80° C. The pressure was relieved and the palladium catalyst, palladium bis(di-isopropylphenylphosphine) diacetate (3 mL of a 0.93 mMol solution in methylene chloride) was added. The reactor was immediately repressurized with hydrogen (90 psig) and allowed to react for 18 h. The reaction mixture was cooled and then filtered through a 0.22 micron Teflon® filter. The resulting filtrate was added to heptane to precipitate the polymer as a white powder. The powder was collected by filtration and dried in a vacuum oven at 80° C. Yield 11.6 g (61%). Mw=17,860; Mn=7270.

Synthesis Example 8

Synthesis Example 7 was repeated except that hydrogen was sparged through the reaction mixture for 15 min prior to pressurizing the reactor with 90 psig hydrogen. Yield 9.95 g (52%). Mw=7900; Mn=4150.

Synthesis Example 9

Synthesis example 1 was repeated except that the endo/exo ratio of the monomer was 85/15. The polymer was isolated by precipitation into hexane.

Yield 65.1 g (80%). Mw=8870; Mn=4880.

Synthesis Example 10

Synthesis example 9 was repeated except that the endo/exo ratio of the monomer was 85/15 and the hydrogen pressure was 50 psig. The polymer was isolated by precipitation into hexane. Yield 60.6 g (76%). Mw=13600; Mn=5700.

Synthesis Example 11

Synthesis example 9 was repeated except that the endo/exo ratio of the monomer was 85/15 and the hydrogen pressure was 50 psig. The polymer was isolated by precipitation into hexane. Yield 61.9 g (77%). Mw=11600; Mn=5820.

Synthesis Example 12

HFANB (40.0 g, 0.146 mol, endo/exo ratio was 90/10), DANFABA (0.0351 g, 0.0438 mMol), triethylsilane (2.31 mL, 14.4 mMol), ethanol (0.940 mL, 16.2 mMol), and toluene (68 mL) were added to a glass vial. The bottle was capped with a septum and mixture was sparged with nitrogen for 15 min. The mixture was then heated to 80° C. and the catalyst, [palladium bis(triisopropylphosphine)(acetonitrile)(acetate)][tetrakis(pentafluorophenyl)bora te] (0.017 g, 0.0146 mMol) was added in a minimum of 1,2-dichloroethane. The mixture was allowed to react for 18 h. The reaction mixture was cooled and added to heptane to precipitate the polymer as a white powder. The powder was collected by filtration, washed with heptane and dried in a vacuum oven at 100° C. Yield 30.7 g (77%). The polymer was redissolved in toluene and reprecipitated into heptane, filtered and dried in a vacuum oven at 100° C. Mw=4670; Mn=3120.

Synthesis Example 13

Synthesis example 12 was repeated except that only 0.28 mL (0.177 mol) of triethylsilane was employed. Yield and molecular weights are reported in Table 1, below.

Synthesis Example 14

Synthesis example 12 was repeated except that 1.1 mL (0.0069 mol) of triethylsilane was employed. Yield and molecular weights are reported in Table 1, below.

Synthesis Example 15

Synthesis example 12 was repeated except that only 0.55 mL (0.0034 mol) of triethylsilane was employed. Yield and molecular weights are reported in Table 1, below.

Synthesis Example 16

HFANB (100 g, 0.365 mol, endo/exo ratio was 78/22), DANFABA(0.088 g, 0.110 mMol), triethylsilane (5.8 mL, 36 mMol), ethanol (2.3 mL, 40 mMol), and toluene (171 mL) were added to a glass vial. The vial was sealed with a septum and heated to 80° C. and the catalyst, [palladium bis(triisopropylphosphine)(acetonitrile)(acetate)][tetrakis (pentafluorophenyl)bora te] (1.0 mL of a 0.0025 M solution in methylene chloride) was added. The mixture was allowed to react for 18 h. The reaction mixture was cooled and a small amount of acetone was added to reduce the viscosity of the solution. The reaction mixture was added to a ten-fold excess of hexane to precipitate the polymer as a white powder. The powder was collected by filtration and dried in a vacuum oven at 90° C. Yield 30.1 g (73%). Mw=5350; Mn=3270.

Synthesis Example 17

Synthesis example 16 was repeated except that 3.1 mL (19 mMol) of triethylsilane was employed. Yield and molecular weights are reported in Table 1, below.

Synthesis Example 18

Synthesis example 16 was repeated except that 1.8 mL (11 mMol) of triethylsilane was employed. Yield and molecular weights are reported in Table 1, below.

Synthesis Example 19

Synthesis example 16 was repeated except that 1.2 mL (7.5 mMol) of triethylsilane was employed. Yield and molecular weights are reported in Table 1, below.

Synthesis Example 20

Synthesis example 16 was repeated except that 0.89 mL (5.6 mMol) of triethylsilane was employed. Yield and molecular weights are reported in Table 1, below.

Synthesis Example 21

HFANB (41.1 g, 0.150 mol, endo/exo ratio was 58/42), DANFABA (1.0 mL of a 0.0075 M solution in methylene chloride), triethylsilane (1.73 g, 0.0148 mol), ethanol (0.77 g, 0.017 mol) and sufficient toluene to bring the total volume to 100 mL were added to a glass vial. The reaction mixture was heated to 80° C. The palladium catalyst, bis(di-isopropylphenylphosphine) diacetate was added (1 mL of a 0.0025 M solution in methylene chloride) to the monomer solution. After 18 h, the reaction mixture was cooled and then added to hexane to precipitate the polymer as a white powder. The powder was collected by filtration and dried in a vacuum oven at 90° C. Yield 30.2 g (73%). Mw=5770; Mn=3560.

Synthesis Example 22

Synthesis example 21 was repeated except that 0.54 mL (4.6 mMol) of triethylsilane was employed. Yield and molecular weights are reported in Table 1, below.

Synthesis Example 23

Synthesis example 21 was repeated except that 0.27 mL (2.3 mMol) of triethylsilane was employed. Yield and molecular weights are reported in Table 1, below.

Synthesis Example 24

HFANB (51.0 g, 0.186 mol, endo/exo ratio was 90:10), 5-norbornene-2-hydroxyethylether ((HEENB) 2.36 g, 0.0140 mol), triethylsilane (2.58 g, 0.0222 mol), ethanol (1.02 g, 0.0222 mol) and sufficient toluene to bring the total volume to 133 mL were added to a glass vial. The reaction mixture was heated to 80° C. DANFABA (1.0 mL of a 0.06 M solution in methylene chloride) and [palladium bis(triisopropylphosphine)(acetonitrile)(acetate)] [tetrakis-(pentafluorophenyl)borate] (1.0 mL of a 0.02 M solution in methylene chloride) was added. After 18 h, the reaction mixture was cooled and then added to 40 mL of Amberlite GT-73 (Rohm and Haas) and Diaion CRBO2 (Mitsubishi Chemical) resin beads. This slurry was shaken overnight. The resin beads were removed by filtration to give a colorless filtrate. The filtrate was concentrated by rotary evaporation and then added to a 10-fold volumetric excess of hexane to precipitate the polymer. The polymer was collected by filtration and dried in a vacuum oven at 90° C. Yield 24.6 g (46%). Mw=4610; Mn=3260. The molar ratio of HFANB:HEENB was found to be 88:12 by $^{13}$C NMR measurements.

Synthesis Example 25

Synthesis example 24 was repeated except that the monomer's endo/exo ratio was 70:30. Yield 19.9 g (37%).

Mw=6740; Mn=4580. The molar ratio of HFANB:HEENB was found to be 86:14 by $^{13}$C NMR measurements.

Synthesis Example 26

Synthesis example 24 was repeated except that the monomer's endo/exo ratio was 58:42. Yield 20.9 g (39%). Mw=7140; Mn=4590. The molar ratio of HFANB:HEENB was found to be 87:13 by $^{13}$C NMR measurements.

Dissolution Rate Method 1 for Examples 1-23

A quartz crystal microbalance (QCM) was employed to study the kinetics of dissolution of the polymer films formed from the several polymers of Examples 1-23 in an aqueous base developer. The quartz crystals employed in this study had an inherent frequency of about 5 MHz. A Maxtek TPS-550 sensor probe and PI-70 driver were used in conjunction with a Phillips PM6654 programmable high resolution frequency counter and an IBM PC. The instrument was controlled and data were collected by a custom-made LabView software program. The polymer was dissolved in propylene glycol methyl ether acetate (⅕ wt/wt) and the solution was filtered down to 0.2 μm. Polymer films were prepared by spin-casting on 1" quartz discs and baked at 130° C. for 60 sec and then the coated discs were mounted on a QCM probe. In 0.26 N tetramethylammonium hydroxide (TMAH) (CD-26), the dissolution of the polymer is more or less linear with time, allowing the calculation of the rates (A/sec) from the slopes of the thickness-development time plots.

The results of these measurements are shown in FIG. 3. Here, the dissolution rate (DR) of each polymer of the aforementioned examples is plotted as a function of a number-average molecular weight (IAn) and exo mol % of the HFANB monomer employed for the polymerization. It should be noted that the plot seems to indicate that the DR of the homopolymer does not seem to be affected by Mn (or Mw) of such polymer. Rather, where the exo concentration of the beginning monomer is high (i.e., 42%) DR is slow (3500-3900 Å/sec), and where the exo concentration of such beginning monomer is low (i.e., <25%) the DR is as much as two times faster (6000-7300 Å/sec).

Dissolution Rate Measurements Example 2.

The copolymers from Synthesis Examples 24, 25, and 26 were dissolved in PGMEA to between 20-25% solids.

A clean silicon wafer (Silicon Quest, <1,0,0>) was spin coated with 1 mL of hexamethyldisilazine (HMDS), 500 rpm for 10 seconds and 2000 rpm for 60 seconds, then baked at 130° C. for 90 seconds. Approximately 1 mL of the filtered (0.2 micron) polymer solution was applied to the center of the wafer and spun as described above. The Wafer was soft baked at 130° C. for 120 seconds to ensure the removal of all of the casting solvent.

Cauchy parameters and film thickness of the samples were determined using a J. A. Woollam M2000 ellipsometer.

Dissolution rate measurement was performed using a reflectometry based Dissolution Rate Monitor, collected and controlled using a custom made Lab-View system, using single wavelength versus time, interferometry data. The developer was aqueous tetramethyl ammonium hydroxide (Shipley, TMAH 2.38%). Samples were developed using a puddle technique in which aliquots of developer are placed upon the film, and film thickness was measured vs. time. The slope of the line of a thickness vs. time plot yields dissolution rate and was expressed as Å/second. Results of these measurements are presented in Table 2.

As in DR data plotted in FIG. 3, and discussed above, the dissolution rates of the polymers of Examples 24, 25, and 26 seem more dependent upon the exo mol % in the starting HFANB monomer. Thus seemingly regardless of molecular weight, the higher the exo mol %, the lower the DR.

Polymer Blend Formulation And Imaging poly(t-butyl 2-trifluoromethylacrylate-co-5-[(1,1',1'-trifluoro-2'-trifluoromethyl-2'-hydroxy)propyl]norbornan-2-yl vinyl ether) (P(TBTFMA-VENBHFA) copolymer) and an HFANB homopolymer (1/1 wt/wt) (one of Examples 12, 15, 16, 19, 21 and 23) were blended by dissolving equal weights of each in propylene glycol methyl ether acetate to make a 10 wt % polymer solution. Di-t-butylphenylidodonium perfluorooctanesulfonate (4%) and tetrabutylammonium hydroxide (0.15%) were added to the polymer solution. The solution was filtered (0.2 μm). The solution was then spin-cast and the resulting films baked at 130° C. for 60 sec, exposed to 193 nm radiation through a binary chrome-on-glass mask, post exposure-baked at 130° C. for 90 sec, and then developed with a commercially available 0.26 N tetramethylammonium hydroxide solution.

Figure 4:
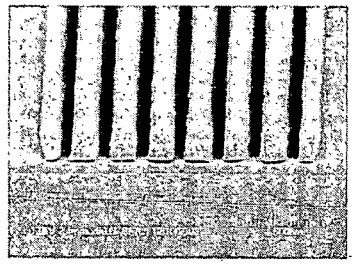
FIG. 4 presents scanning electron micrographs of polymer blends having about 50 wt % of a homopolymer having selected exo mol % and a relatively high molecular weight.
Figure 4:
Figure 4:
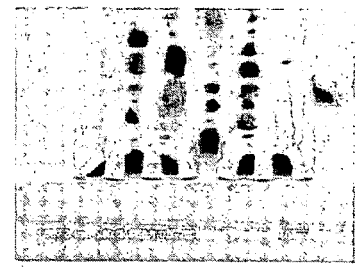
Figure 5:
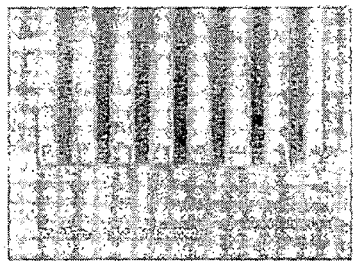
FIG. 5 presents scanning electron micrographs of polymer blends having about 50 wt % of a homopolymer having selected exo mol % and a relatively low molecular weight.
Figure 5:
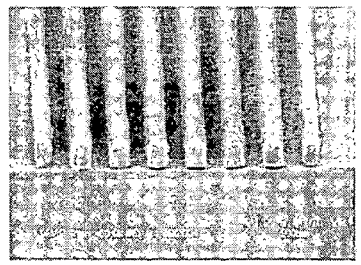
Figure 5:
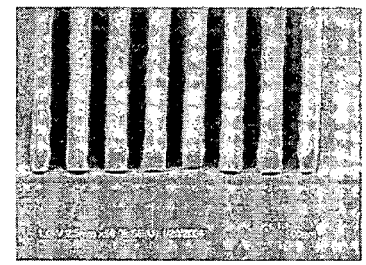

Referring to FIGS. 4 and 5, scanning electron micrographs of spin cast films, such as described above, are shown after exposure (120 nanometer (nm) lines and spaces) and image development. In FIG. 4, the micrographs are of the relatively high Mn blends that use the homopolymers of Examples 23, 19 and 16. As seen, the image quality is best for the polymer blend having the highest exo mol %. In FIG. 5; the micrographs are of the relatively low Mn blends that use the homopolymers of Examples 21, 16 and 12. As seen, the image quality seems relatively uniform for all samples with no obvious trend in image quality visible and/or corresponding to exo mol %. However it is most interesting to note that the best imaging result of FIG. 4 is comparable to the imaging results of FIG. 5 despite the significant difference in molecular weight of the HFANB homopolymer employed in the blend. This result is unexpected and suggests that control of exo isomer mol % can provide a relatively uniform imaging quality of a broad range of molecular weights. Thus providing a wider processing window both for the actual imaging and for the composition of the photoresist.

The copolymer is represented by the structure below where the percentages are the relative concentration of the individual monomers in the copolymer.

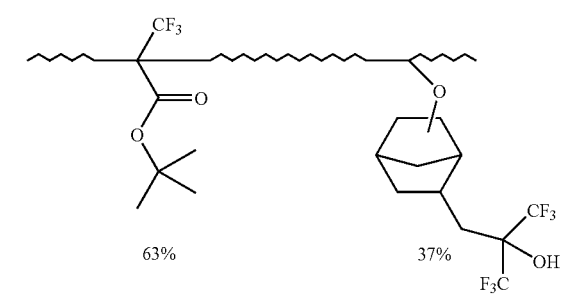

Thus, it can be said from the imaging results presented above, that when the molecular weight of HFANB homopolymer is high (see, FIG. 4), the best image quality is seen where the exo mol % of the HFANB starting polymer is the highest (58/42). Where the exo mol % is low (90/10), the image is severely bridged.

Where the molecular weight of the HFANB starting monomer is low (FIG. 5), it seems as if the performance of all the blends is uniformly good and independent of exo mol %. Thus, by providing a desired exo isomer mole percent in at least one repeating unit of a polymer used in a photoresist composition, control of the differential dissolution rate appears to allow for a broad range of polymer molecular weights to provide good image quality.

TABLE 1

| Ex. No. | Yield | Mw | Mn | CTA* | Peracid | Endo:Exo | DR (Å/sec) |
|---|---|---|---|---|---|---|---|
| 1 | 66% | 11300 | 5440 | $H_2$ | No | 44/56 | 4089 |
| 2 | 50% | 6400 | 3630 | $C_2H_4$ | Yes | 70/30 | 3916 |
| 3 | 60% | 12900 | 5930 | $C_2H_4$ | Yes | 70/30 | 2741 |
| 4 | 60% | 16300 | 8000 | $C_2H_4$ | Yes | 70/30 | 3552 |
| 5 | 62% | 28000 | 12100 | $C_2H_4$ | Yes | 70/30 | 3361 |
| 6 | 60% | 36200 | 15500 | $C_2H_4$ | Yes | 70/30 | 3516 |
| 7 | 61% | 17860 | 7270 | $H_2$ | No | 70/30 | 2904 |
| 8 | 52% | 7900 | 4150 | $H_2$ | No | 70/30 | 3428 |
| 9 | 80% | 8870 | 4880 | $H_2$ | No | 85/15 | 6432 |
| 10 | 76% | 13600 | 5700 | $H_2$ | No | 85/15 | 5801 |
| 11 | 77% | 11600 | 5820 | $H_2$ | No | 85/15 | 6570 |
| 12 | 77% | 4670 | 3120 | $Et_3SiH$ | No | 90/10 | 6588 |
| 13 | 72% | 31230 | 14380 | $Et_3SiH$ | No | 90/10 | 6486 |
| 14 | 76% | 8980 | 5260 | $Et_3SiH$ | No | 90/10 | 7300 |
| 15 | 65% | 16510 | 8530 | $Et_3SiH$ | No | 90/10 | 6526 |
| 16 | 77% | 5350 | 3270 | $Et_3SiH$ | No | 78/22 | 6627 |
| 17 | 87% | 9030 | 5070 | $Et_3SiH$ | No | 78/22 | 6045 |
| 18 | 89% | 15700 | 7490 | $Et_3SiH$ | No | 78/22 | 6740 |
| 19 | 91% | 22700 | 10600 | $Et_3SiH$ | No | 78/22 | 6423 |
| 20 | 93% | 31900 | 13700 | $Et_3SiH$ | No | 78/22 | 6543 |
| 21 | 73% | 5770 | 3560 | $Et_3SiH$ | No | 58/42 | 3920 |
| 22 | 91% | 16400 | 7520 | $Et_3SiH$ | No | 58/42 | 3850 |
| 23 | 77% | 28700 | 12900 | $Et_3SiH$ | No | 58/42 | 3510 |

*CTA stands for Chain Transfer Agent

TABLE 2

| Example # | Yield | Mw | Mn | CTA | Endo:Exo | DR (Å/sec) |
|---|---|---|---|---|---|---|
| 24 | 46% | 4610 | 3260 | $Et_3SiH$ | 90/10 | 1920 |
| 25 | 37% | 6740 | 4580 | $Et_3SiH$ | 70/30 | 510 |
| 26 | 60% | 7140 | 4590 | $Et_3SiH$ | 48/52 | 460 |

We claim:

1. A method for forming a photoresist composition having a desired dissolution rate comprising:

determining a first exo mole percent of a polycyclic olefin monomer having a fluorinated carbinol pendent group as represented by Formula A:

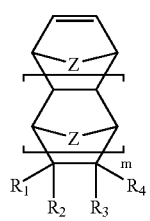

A where m is an integer from 0 to 5; and Z represents -$(CH_2)_p$-, where p is equal to 1 or 2; and where at least one of $R_1$ to $R_4$ is, independently, a fluorinated carbinol pendent group having from 1 to 20 carbon atoms, each carbon atom, independently, being substituted with 1, 2, or 3 fluorine atoms and where the oxygen atom is protected by a blocking or protective group that is acid cleavable;

forming a first polymer comprising repeating units derived from said polycyclic olefin monomer;

determining a first dissolution rate of said polymer;

modifying the first exo mole percent of said polycyclic olefin monomer to a second exo mole percent greater than or less than the first exo mole percent;

forming a second polymer comprising repeating units derived from the polycyclic olefin monomer having the second exo mole percent; and formulating the photoresist composition, such composition comprising the second polymer.

2. The method of claim 1, where the fluorinated carbinol pendent group of the at least one repeating unit is selected from —$(CR_2)_n$OR', —(O—$(CH_2)_n)_n$—$C(CF_3)_2$—OR', —$(CH_2O)_n$—$C(CF_3)_2$—OR', —$((CH_2)_nO)_n$—$CH_2$—$C(OR')(CF_3)_2$ where each occurrence of n is an independently selected integer from 0 to 5, each occurrence of R is independently hydrogen or fluorine and where R' is a group selected from dimethyl ether, methyl ethyl ether, 2-methyl-norbornyl, 2-methylisobornyl, 2-methyl-2-adamantyl, tetrahydrofuranyl, tetrahydropyranoyl, 3-oxocyclohexanonyl, mevalonic lactonyl, dicyclopropylmethyl (Dcpm), dimethylcyclopropylmethyl (Dmcp) and -C(O)OR" where R" is a t-butyl, trimethylsilyl, 2-methylnorbornyl, 2-methylisobornyl, 2-methyl-2-adamantyl, tetrahydrofuranyl, tetrahydropyranoyl, 3-oxocyclohexanonyl, mevalonic lactonyl, Dcpm, or Dmcp group, or combinations thereof.

3. The method of claim 2, where the second exo mole percent for the carbinol pendent group is greater than the expected exo isomer mole percent for the polycyclic olefin monomer.

4. The method of claim 3 where the polycyclic olefin based polymer further comprises repeat units derived from polycyclic olefin monomers represented by one or more of Formulae A2, B and C:

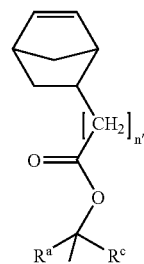

Formula A2

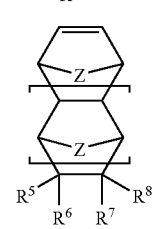

Formula B

-continued

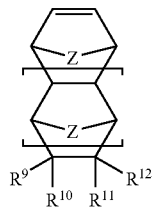

Formula C where for Formula A2, n' is an integer from 0 to 5 and $R^a$, $R^b$, and $R^c$, independently, represent linear or branched $C_1$ to $C_{20}$ hydrocarbyl groups or $R^a$ and $R^b$ taken together along with the common carbon to which they are attached represent a saturated cyclic group containing 4 to 12 carbon atoms; and where for Formula B, m and Z are as previously defined and each of $R^5$, $R^6$, $R^7$ and $R^8$, independently, are H, a fluorine, a linear, branched or cyclic $C_1$ to $C_{30}$ alkyl, alkylol, aryl, aralkyl, alkaryl, alkenyl or alkynyl; with the proviso that at least one of $R^5$, $R^6$, $R^7$ and $R^8$ is a firnctional group that is capable of crosslinking and where for Formula C, m and Z are as previously defined and each of $R^9$, $R^{10}$, $R^{11}$ and $R^{12}$, are each an independently selected neutral substituent selected from the group of substituents consisting of fluorines, $-(CH_2)_nC(O)OR^{21}$, $-(CH_2)_n-(CM_2)_n-OR^{18}$, $-(CM_2)_n-OC(O)R^{17}$, $-(CH_2)_n-C(O)OR^{17}$, $-(CH_2)_n-C(O)R^{18}$, $-(CH_2)_nC(R^{19})_2CH(R^{19})(C(O)OR^{20})$, $-(CH_2)_n-NH-(SO_2)-CF_3$, $-(CH_2)_nC(R^{19})2CH(C(O)OR^{20})_2$, $-C(O)O-(CH_2)_n-OR^{18}$, $-(CH_2)_n-(O-(CH_2)_n-OR^{18}$ and $-(CH_2)_n-(O-(CH_2)_n)_n-C(CF_3)_2OR^{21}$ where each occurrence of n is independently an integer from 0 to 5, M can be hydrogen or fluorine, $R^{19}$ can independently be hydrogen, fluorine, a linear or branched $C_1$ to $C_{10}$ alkyl group or cycloalkyl group or a linear or branched $C_1$ to $C_{10}$ fluorinated alkyl cycloalkyl group, $R^{18}$ can independently be hydrogen, a linear or branched $C_1$ to $C_{10}$ alkyl group or cycloalkyl group or a linear or branched $C_1$ to $C_{10}$ fluorinated alkyl or cycloalkyl group, $R^{20}$ is not readily cleavable by an acid from a photoacid generator and can independently be a linear or branched $C_1$ to $C_{10}$ alkyl group or cycloalkyl group, or a linear or branched $C_1$ to $C_{10}$ fluorinated alkyl or cycloalkyl group, $R^7$ is not readily cleavable by a photoacid generator and can independently be linear or branched $C_1$ to $C_{10}$ alkyls or fluorinated alkyls, a monocyclic or polycyclic $C_4$ to $C_{20}$ cycloaliphatic or fluorinated cycloalkyl moiety, a cyclic ether, a cyclic ketone or a cyclic ester (lactone), where each of the cyclic ether, ketone and ester can be fluorinated or not and $R^{21}$ is defined as $R^{17}$ plus hydrogen.

5. The method of claim 2, where the second exo mole percent for the carbinol pendent group is greater than the expected exo isomer mole percent for the polycyclic olefin monomer.

6. The method of claim 5 the polycyclic olefin based polymer further comprises repeat units derived from polycyclic olefin monomers represented by one or more of Formulae A2, B and C:

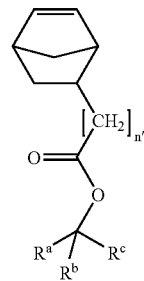

Formula A2

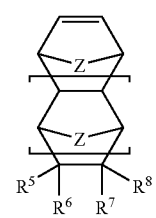

Formula B

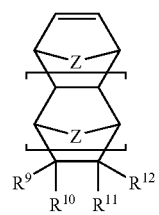

Formula C where for Formula A2, n' is an integer from 0 to 5 and $R^a$, $R^b$, and $R^C$, independently, represent linear or branched $C_1$ to $C_{20}$ hydrocarbyl groups or $R^a$ and $R^b$ taken together along with the common carbon to which they are attached represent a saturated cyclic group containing 4 to 12 carbon atoms; and where for Formula B, m and Z are as previously defined and each of $R^5$, $R^6$, $R^7$ and $R^8$, independently, are H, a fluorine, a linear, branched or cyclic $C_1$ to $C_{30}$ alkyl, alkylol, aryl, aralkyl, alkaryl, alkenyl or alkynyl; with the proviso that at least one of $R^5$, $R^6$, $R^7$ and $R^8$ is a functional group that is capable of crosslinking and where for Formula C, m and Z are as previously defined and each of $R^9$, R10, $R^{11}$ and $R^2$, are each an independently selected neutral substituent selected from the group of substituents consisting of fluorines, $-(CH_2)_n-C(O)OR^{21}$, $-(CH_2)_n-(CM_2)_n-OR^{18}$, $-CM_2)_n-OC(O)R-(CH_2)_n-OC(O)OR^{17}$, $-(CH_2)_n-C(O)R^{18}$, $-(CH_2C(R^{19})_2CH(R^{19})(C(O)OR^{20})$, $-(CH_2)_n-NH-(SO_2)-CF_3,-(CH_2)_{C(R}{}^{19})_2CH(C(O)OR^{20})_2,-C(O)O-_n-OR^{18}$, $-(CH_2)_n-(O-(CH_2)_n-OR^{18}$ and $-(CH_2)_n-O-(CH_2)_n)_n-C(CF_3)_2OR^{21}$ where each occurrence of n is independently an integer from 0 to 5, M can be hydrogen or fluorine, $R^{19}$ independently be hydrogen, fluorine, a linear or branched $C_1$ to $C_{10}$ alkyl group or cycloalkyl group or a linear or branched $C_1$ to $C_{10}$ fluorinated alkyl cycloalkyl group, $R^{18}$ can independently be hydrogen, a linear or branched $C_1$ to $C_{10}$ alkyl group or cycloalkyl group or a linear or branched $C_1$ to $C_{10}$ fluorinated alkyl or cycloalkyl group, $R^{20}$ is not readily cleavable by an acid from a photoacid generator and can independently be a linear or branched $C_1$ to $C_{10}$ alkyl group or cycloalkyl group, or a linear or branched $C_1$ to $C_{10}$ fluorinated alkyl or cycloalkyl group, $R^{17}$ is not readily cleavable by a photoacid generator and can independently be linear or branched $C_1$ to $C_{10}$ alkyls or fluorinated alkyls, a monocyclic or polycyclic $C_4$ to $C_{20}$ cycloaliphatic or fluorinated cycloalkyl moiety, a cyclic ether, a cyclic ketone or a cyclic ester (lactone), where each of the cyclic ether, ketone and ester can be fluorinated or not and $R^{21}$ is defined as $R^{17}$ plus hydrogen.

* * * * *